United States Patent
Krawczyk et al.

(10) Patent No.: US 6,531,910 B1
(45) Date of Patent: Mar. 11, 2003

(54) SYMMETRIC MULTIPLEXER

(75) Inventors: Thomas W. Krawczyk, Troy, NY (US); John F. McDonald, Clifton Park, NY (US); Matthew W. Ernest, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/951,008

(22) Filed: Sep. 12, 2001

Related U.S. Application Data

(60) Provisional application No. 60/232,090, filed on Sep. 12, 2000.

(51) Int. Cl.⁷ .............................................. H03K 17/62
(52) U.S. Cl. ......................................... 327/407; 327/411
(58) Field of Search ..................... 327/99, 407, 408, 327/409, 410, 411, 412, 413

(56) References Cited

U.S. PATENT DOCUMENTS

| | | | |
|---|---|---|---|
| 4,686,674 A | * 8/1987 | Lam | ............................ 327/412 |
| 4,963,767 A | 10/1990 | Sinh | |
| 5,304,853 A | * 4/1994 | Choi | ............................ 327/411 |
| 5,475,344 A | 12/1995 | Maneatis et al. | |
| 5,592,126 A | 1/1997 | Boudewijns et al. | |
| 5,841,325 A | 11/1998 | Knotts et al. | |
| 6,208,193 B1 | * 3/2001 | Moyal et al. | ................. 327/411 |
| 6,211,721 B1 | * 4/2001 | Smetana | ...................... 326/126 |
| 6,239,646 B1 | * 5/2001 | Navabi et al. | .............. 327/407 |

OTHER PUBLICATIONS

Peter M. Campbell et al., "A Very–Wide Bandwidth Digital VCO Implemented in GaAs HBTs Using frequency Multiplication and Division," $17^{th}$ Annual GaAs IC Symposium Technical Digest, pp. 311–314, Oct. 1995.

Richard C. Walker et al., "A 10Gb/s Si–Bipolar TX/RX Chipset for Computer Data Transmission," IEEE International Solid–State Circuits Conference, pp. 19.1/1–19.1/11, 1998.

* cited by examiner

Primary Examiner—My-Trang Nu Ton
(74) Attorney, Agent, or Firm—Wolf, Greenfield & Sacks, P.C.

(57) ABSTRACT

A multiplexer is provided that is symmetric in that substantially the same delay is experienced from any input of the multiplexer to the multiplexer output. It is realized that in conventional serial transmission systems, standard Current Mode Logic (CML) multiplexers are used which are asymmetric and exhibit different delays between select and data inputs. Because of these delays, conventional transmission systems experience jitter at high frequencies. To extend the operable range of communication systems, a symmetric multiplexer may be used which has substantially the same delay from any input to the multiplexed output, thus reducing jitter. For example, the multiplexer may be part of a communication system having a serial data transmission circuit.

15 Claims, 7 Drawing Sheets

| S | A | B | T1 | T2 | T3 | T4 | Z1 | Z0 |
|---|---|---|----|----|----|----|----|----|
| 0 | 0 | 0 | 0  | −1 | −1 | −2 | 0  | 1  |
| 0 | 0 | 1 | 0  | −2 | −1 | −1 | 0  | 1  |
| 0 | 1 | 1 | −1 | −2 | 0  | −1 | 1  | 0  |
| 0 | 1 | 0 | −1 | −1 | 0  | −2 | 1  | 0  |
| 1 | 1 | 0 | −2 | 0  | −1 | −1 | 0  | 1  |
| 1 | 1 | 1 | −2 | −1 | −1 | 0  | 1  | 0  |
| 1 | 0 | 1 | −1 | −1 | −2 | 0  | 1  | 0  |
| 1 | 0 | 0 | −1 | 0  | −2 | −1 | 0  | 1  |

*FIG. 2*

ALTERNATE

ORIGINAL

ALTERNATE

SYMMETRIC MULTIPLEXER

RELATED APPLICATIONS

This application claims the benefit under Title 35 U.S.C. §119(e) of co-pending U.S. provisional application Ser. No. 60/232,090 filed Sep. 12, 2000, entitled "SYMMETRIC MULTIPLEXER", by M. Ernest, T. Krawczyk, and J. McDonald, the contents of the aforementioned application is incorporated herein by reference in its entirety.

BACKGROUND OF THE INVENTION

1. Field of the Invention

The field of the invention relates generally to multiplexers, and more particularly, multiplexers used for high-speed transmission.

2. Discussion of the Related Art

The current high-growth nature of digital communications demands higher speed serial communication circuits. Present day technologies barely manage to keep up with the present need to communicate at high speeds, e.g. gigabit, terabit, and higher transmission speeds. New techniques are needed to ensure that methods for serial communication can continue to expand and grow.

Multiplexers are typically used in communication systems to multiplex lower rate data signals onto a higher rate channel. Examples of communication systems include optical communication systems (e.g. SONET communication systems) which multiplex multiple data streams onto a single channel in a serial manner. Other communication system types also use multiplexers, such as communication devices that operate in LANs, internal communication systems of a computer system, processors of a multiprocessor system, and the like.

SUMMARY OF THE INVENTION

According to one embodiment of the invention, a multiplexer is provided that is symmetric in that substantially the same delay is experienced from any input of the multiplexer to any multiplexer output. According to one aspect of the invention, it is realized that in conventional serial transmission systems, standard Current Mode Logic (CML) multiplexers are used which are asymmetric and exhibit different delays between select and data inputs. Because of these delays, conventional transmission systems experience jitter at high frequencies. More particularly, it is-realized that time differences between a transition on a select input of a multiplexer and a transition of a data input of the multiplexer produce a temporal offset in subsequent transitions of the output of the multiplexer. To extend the operable range of communication systems, a symmetric multiplexer may be used which has substantially the same delay from any input to the multiplexed output, thus reducing jitter. Further, it is realized that it would be beneficial to produce a multiplexer that presents the same loading characteristics to each data input and select line of the multiplexer.

For example, the multiplexer may be part of a communication system having a serial data transmission circuit. More particularly, there are conventional serial data transmission circuits that utilize an output retiming circuit, and require clocking at the same frequency as the output bit rate. At bit rates above, for example, 10 Gb/s, this conventional method becomes prohibitive, because of the lack of Voltage Controlled Oscillators (VCOs) capable of operating at this speed. A symmetric multiplexer architecture addresses the issue by utilizing ring oscillators which are not available with typical LC tanks. The multi-phase nature of ring oscillators enables the serial data transmission circuit to use a clock frequency, for example, of one-quarter the 20 Gb/s bit rate, or 5 GHz. This example communication technique implements two signals in quadrature from a VCO.

According to one aspect of the invention, a multiplexer is provided comprising data, select, and output terminals, wherein a first delay between the select and output terminals is substantially identical to a second delay measured between the data and output terminals. According to another embodiment of the invention, the multiplexer further comprises a first and second symmetric half, each half including a differential current switch for each of a first and second input terminals and the select terminals, and wherein each of the first and second halves is associated with a first and second output, the first and second output being complimentary signals.

According to another embodiment of the invention, load measured from the data and select terminals is substantially identical. According to another embodiment of the invention, each differential current switch is coupled to a current switch comprising a plurality of transistors, wherein each of the differential current switches is adapted to remove a unit of current from at least one of the plurality of transistors.

According to another embodiment of the invention, each of the differential current switches is coupled to the current switch by a respective input line, and wherein for each transition on any one of the first and second input terminals, a current measured on each of the respective input lines does not change by more than one unit of current.

According to another embodiment of the invention, each of the differential current switches is coupled to the current switch by a respective input line, and wherein for each transition on both of the first and second input terminals, a current measured on each of the respective input lines does not change by more than one unit of current.

According to another embodiment of the invention, each of the differential current switches is coupled to the current switch by a respective input line, and wherein for each transition on both the select terminal and at least one of the first and second input terminals, a current measured on each of the respective input lines does not change by more than one unit of current.

According to another embodiment of the invention, the current switch includes at least four input lines, and wherein each of the four input lines is coupled to at least two of the differential current switches, and wherein the at least two of the differential current switches is configured to remove at least one of zero, one, and two units of current from a respective input line.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

The invention is pointed out with particularity in the appended claims. The above and further advantages of this invention may be better understood by referring to the following description when taken in conjunction with the accompanying drawings in which similar reference numbers indicate the same or similar elements.

In the drawings,

FIG. 2 is a table showing logic relations between inputs, term lines and outputs in accordance with one embodiment of the invention;

DETAILED DESCRIPTION

Figure 1:
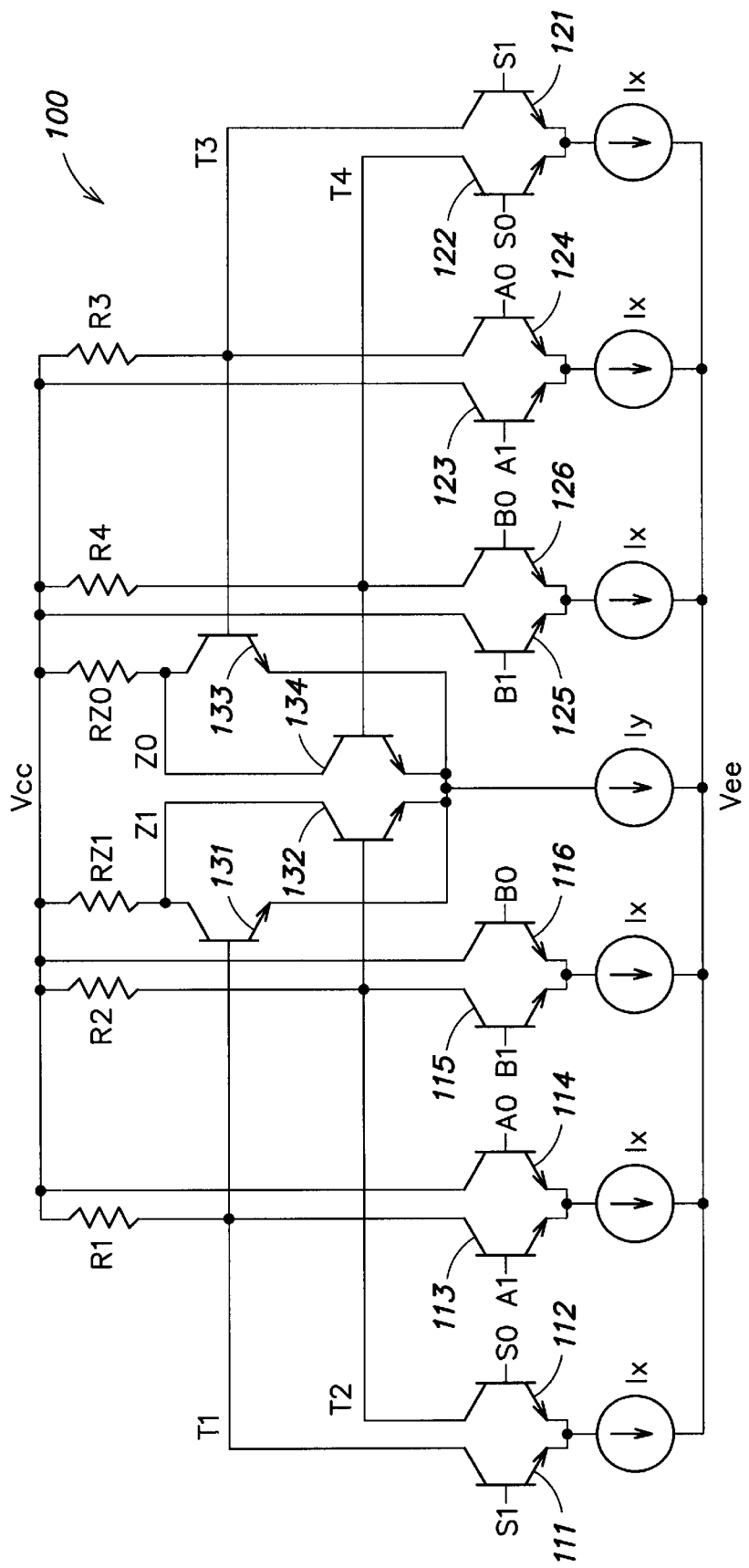
FIG. 1 is a block diagram showing one embodiment of a symmetric multiplexer in accordance with one embodiment of the invention.

A multiplexer 100 according to one embodiment of the present invention as shown in FIG. 1 comprises two symmetric halves, the right half which may be described easily in relation to its differences with respect to the left half. The left half of the symmetric multiplexer provides a differential current switch (DCS) for each of three differential inputs, one select (S) and two data (A, B).

Each DCS comprises two transistors 111 and 112 whose emitters each are connected to a common node. Transistors 111 and 112 divert the one unit of current Ix which is applied to that common emitter node to the node connected to a collector of one of the other of the transistors. The current is applied according to which of the differential lines connected to the two transistor bases of the DCS is at a higher potential. The DCS which receives the S input is connected to intermediate term lines T1, T2 such that the one unit of current is removed from T1 when S is asserted (S1 is at a higher potential than S0) and one unit of current is removed from T2 when S is not asserted (S0 higher than S1).

Similar connections are made from the DCS (items 113, 114) connected to the A input, except that when A is asserted the unit of current is removed from T1, but when A is not asserted, the unit of current is removed from Vcc, not T2. Similar connections are also made for the DCS (115, 116) connected to the B input, except that when B is asserted the unit of current is removed from T2 and when B is not asserted the unit of current is removed from Vcc.

Because two DCSs are connected to each term line (T1 and T2), either two, one, or no units of current may be removed from each term line. The amount of current removed from a term line by a DCS is equal to the amount of current that flows onto the respective term line via pull-up resistors R1, R2 connected to supply Vcc. Thus, the potential on each term line T1, T2 takes on a high, medium, or low value in proportion to the current removed by the DCS connected to each term line T1, T2.

The right half of multiplexer 100 is constructed in a similar manner as the left half. Differences between the right and left halves include: the S input DCS (121, 122) removes one unit of current from T3(T4) when S is asserted (not asserted); the A input DCS (123, 124) removes one unit of current from Vcc (T3) when A is asserted (not asserted); and the B input DCS (125, 126) will remove one unit of current from Vcc (T4) when B is asserted (not asserted).

Given the above connection of the term lines, it can be seen that T1 has one unit of current removed if S is asserted and another if A is asserted, so if the typical representation of 1 for asserted and 0 for not asserted is used for the inputs, the condition of T1 may be represented as a three-valued logic {0,−1,−2} and would be given by the function $T1=-(S+A)$. Similarly, the terms T2, T3, and T4 are defined as follows:

$T2=-(\bar{S}+B)$ $T3=-(S+\bar{A})$ $T4=-(\bar{S}+\bar{B})$

Central to the multiplexer is a quad current switch (QCS) including four transistors sharing a common emitter node with current Iy applied to it, each transistor 131, 132, 133, 134 each receiving a term line T1, T2, T3, T4, respectively.

FIG. 2 is a table showing logic relations between inputs, term lines and outputs in accordance with one embodiment of the invention. In particular, FIG. 2 shows that exactly one term line will have no current removed from it, and thereby be at the highest potential, so whichever term line shall be at the highest potential shall hold the base of the transistor to which it is connected at the highest potential, and thus the current Iy will be removed from the node connected to the collector of that particular transistor. As each of the collectors are connected to one of two output nodes (Z1, Z0) and the current removed from each node will be equal to the current through the pull-up resistors (RZ1, RZ0), one of these nodes will be pulled low with the other node remaining high, thus forming a differential output.

Output Z1 is pulled low when either T1=0 or T2=0, which conditions shall occur when S=0 and A=0, and S=1 and B=0, respectively. Therefore, the state of the output $\overline{Z1}$ is shown to be $\overline{Z1}=\overline{S}\ \overline{A}+S\ \overline{B}$, the inverse of which is $Z1=\overline{S}A+S\ B$ and shows that a multiplexed output is produced at Z1. Likewise, Z0 shall be pulled low when T3=0 or T4=0, and these conditions occur when S=0 and A=1, and S=1 and B=1 respectively. It follows that $\overline{Z0}=\overline{S}\ A+S\ B$, or $Z0=\overline{S}\ \overline{A}+S\ \overline{B}$, demonstrating that Z1, Z0 outputs are a differential pair of outputs.

Advantages of the above-described multiplexer design include:

All inputs (S, A, B) enter on the same level.

All inputs (S, A, B) see the same load.

The phase skew between data and select inputs exhibited by a conventional CML multiplexer is eliminated by the above design.

For every possible single input transition, the current on no term line changes by more than one unit.

For every possible dual input change of the data inputs, the current on no term line changes by more than one unit.

For every possible dual input change of the select input and one data input where the output of an ideal multiplexer does not change the current on no term line changes by more than one unit.

Having described several embodiments of the invention, there are alternative embodiments which may be used that perform in a similar manner. For example, some of these various alternatives include, but are not limited to the alternatives shown in FIGS. 3B–3E, 4B, 5B, and 6B, each of which is a modification of an aspect of the original multiplexer configuration shown in FIG. 1.

Figure 3A:
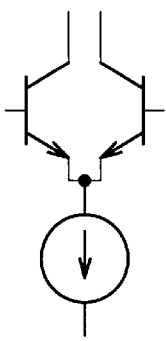
FIG. 3A is a block diagram showing the original configuration of the common node of emitters of a differential current switch (DCS) coupled to a current source as shown in FIG. 1.
Figure 3B:
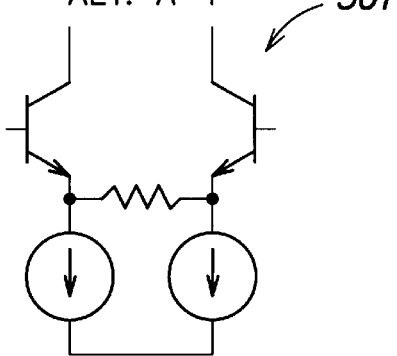
FIGS. 3B–3E are block diagrams showing alternative circuit configurations for the symmetric multiplexer shown in FIG. 1 replacing the common node of emitters of a differential current switch (DCS) coupled to a current source shown in FIG. 3A.
Figure 3C:
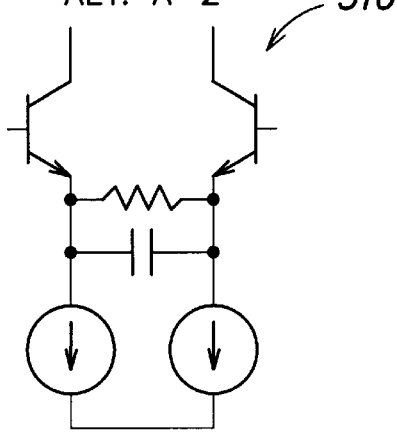
Figure 3D:
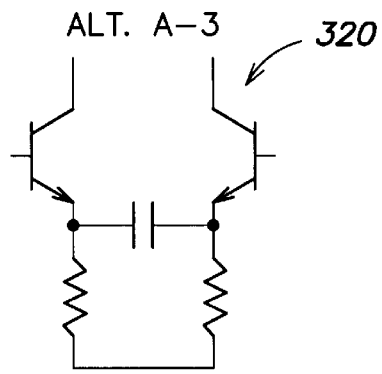
Figure 3E:
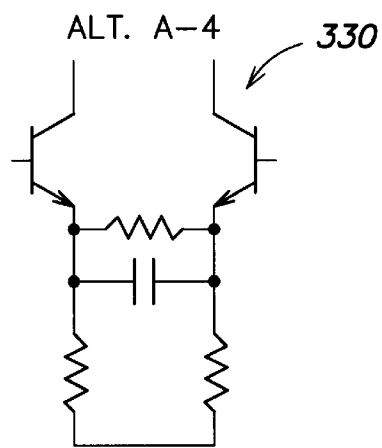

Alternatives A (FIGS. 3B–3E):

The common node of the emitters of the DCS connected to the inputs and the currents source connected thereto may be replaced by:

- As shown in FIG. 3B: a resistor between the emitters, with a current source at each emitter, the combined current being that of the original current source;
- As shown in FIG. 3C: a resistor and a capacitor in parallel between the emitters, with a current source at each emitter, the combined current being that of the original current source;
- As shown in FIG. 3D: a capacitor between the emitters, with a resistor at each emitter, the remaining terminals of the two resistors being tied together at a common node, being either Vee or some node with a current source; or
- As shown in FIG. 3E: a resistor and a capacitor in parallel between the emitters, with a resistor at each emitter, the remaining terminals of the two resistors being tied together a common node, being either Vee or some node with a current source.

Figure 4A:
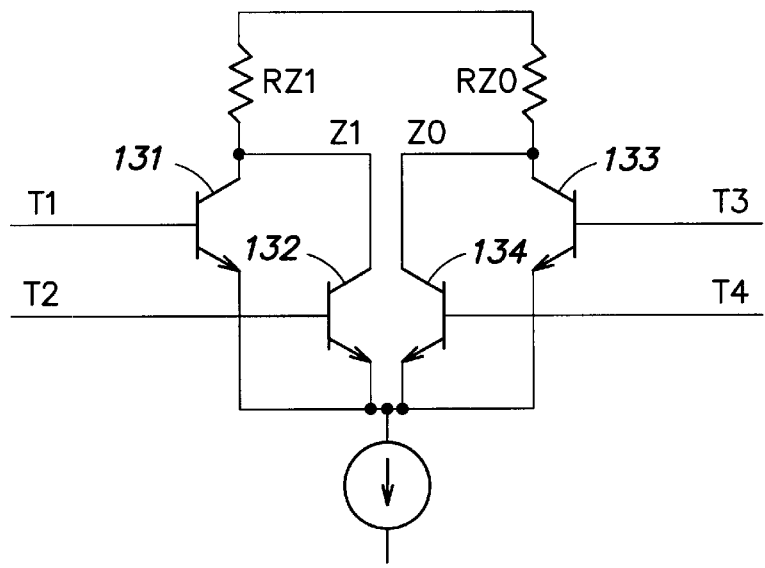
FIG. 4A is a block diagram showing the original configuration of a quad current switch (QCS) as shown in FIG. 1.
Figure 4B:
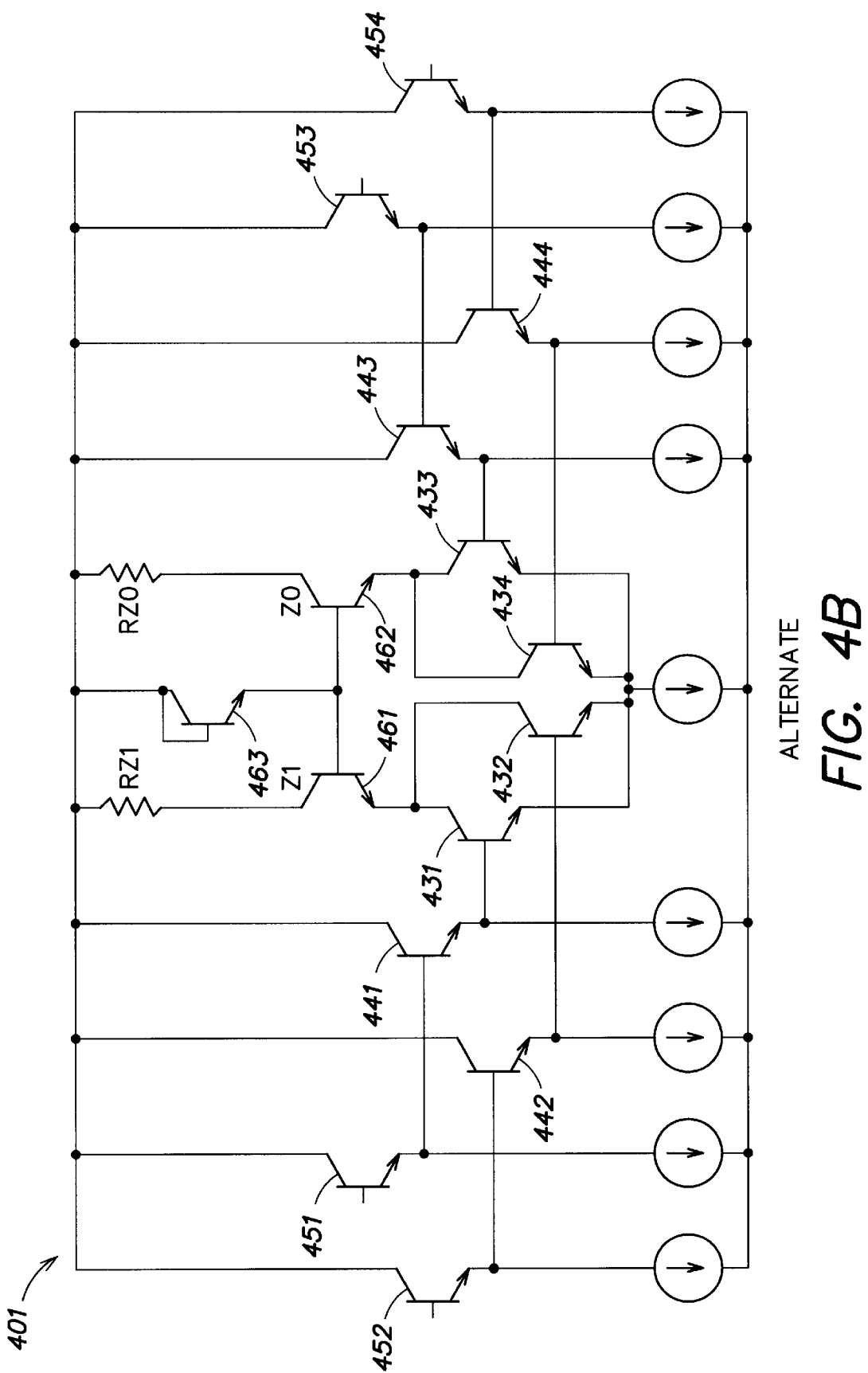
FIG. 4B is a block diagram showing an alternative circuit configuration of the symmetric multiplexer shown in FIG. 1 replacing the quad current switch (QCS) as shown in FIG. 4A.

Alternative B: The QCS (131, 132, 133, 134) which is driven by the term lines T1, T2, T3 T4 (as shown in FIG. 4A) may be replaced with (as shown in circuit 401 of FIG. 4B) two emitter followers (441–444, 451–454) between each term line and its respective transistor in the QCS; the QCS (431–434); and a pair of common-base amplifiers (461–462) in series between the QCS and the Pull-up resistors RZ1 and RZ0 comprising of either a transistor corresponding to each output node, with its collector tied to that node, its emitter tied to the common collector node of the transistors otherwise connected to the output node, and the bases of such transistors tied together and biased by a transistor (463) the emitter of which is tied to the common base node and the collector and base of which are tied to Vcc, or four common base amplifiers connected as above excepting that the emitter of a common base amplifier shall be tied to the collector of one transistor of the QCS.

Figure 5A:
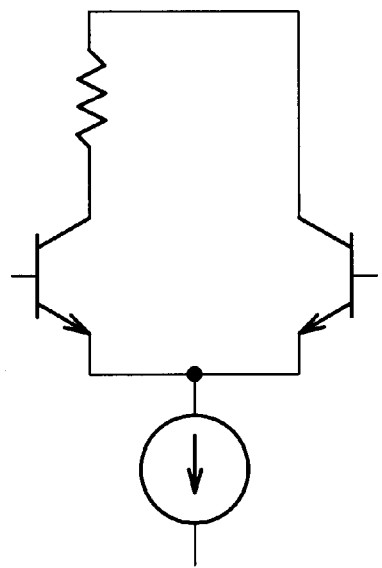
FIG. 5A is a block diagram showing the original configuration of an input DCS shown in FIG. 1.
Figure 5B:
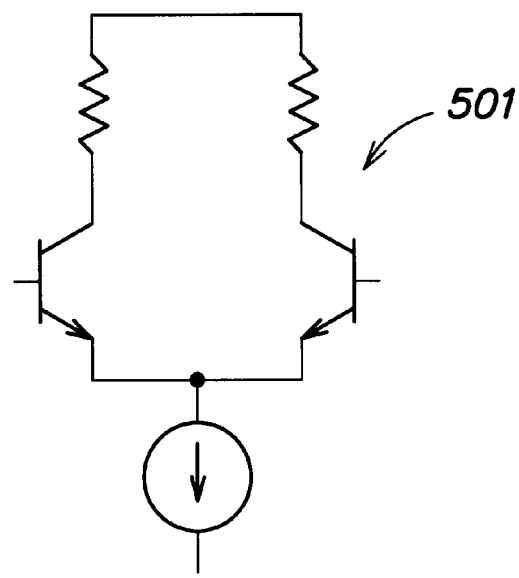
FIG. 5B is a block diagram showing another alternative circuit configuration of the symmetric multiplexer shown in FIG. 1, wherein the input DCS configuration shown in FIG. 5A is replaced by the alternative circuit configuration.

Alternative C: The collectors of transistors of input DCS not tied to a term line (114, 116, 124, 126) (shown in FIGS. 1 and 5A) may be tied to supply Vcc via a pull up resistor to further balance the loading of the data input DCS to the select input DCS as is shown in circuit 501 of FIG. 5B.

Figure 6A:
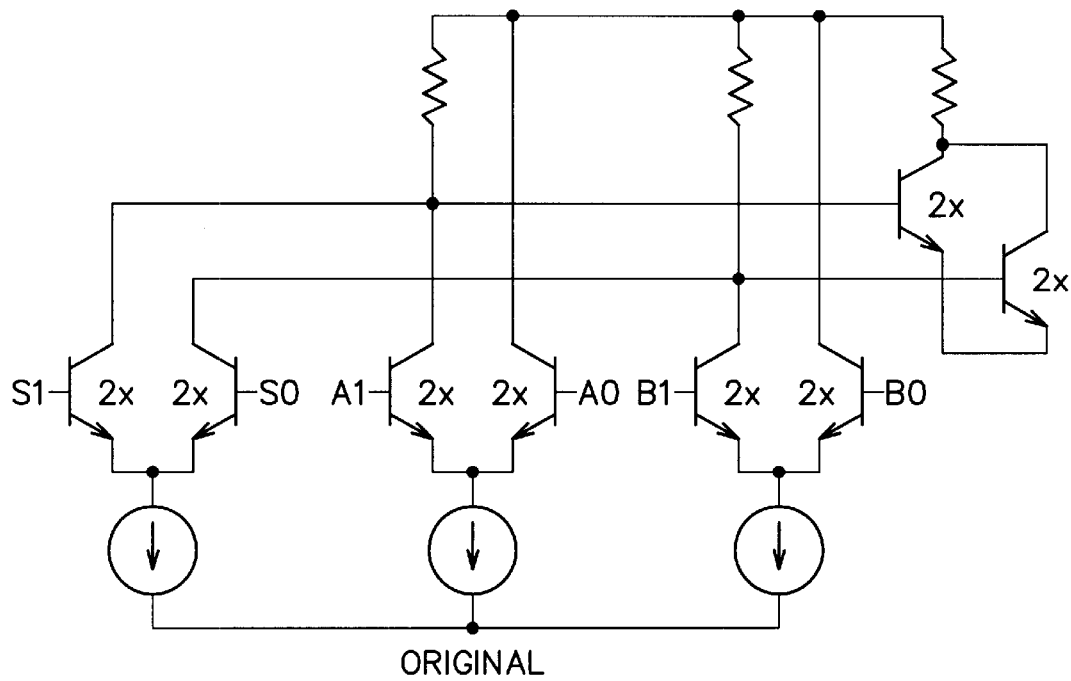
FIG. 6A is a block diagram showing the original configuration of transistors of the QCS shown in FIG. 1.
Figure 6B:
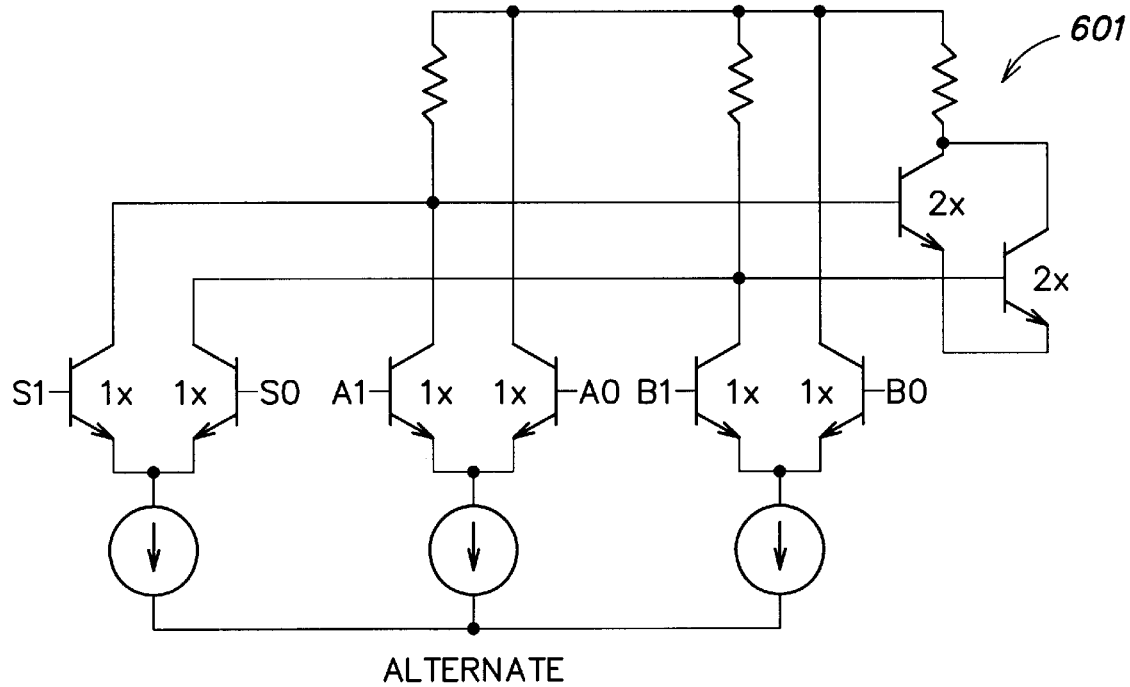
FIG. 6B is a block diagram showing another alternative circuit configuration of the symmetric multiplexer shown in FIG. 1, wherein the area of transistors of the QCS is increased by a factor of two.

Alternative D: Whereas a transistor in the QCS is driven by two transistors from the input DCS (as shown in FIG. 6A), the ratio of individual transistor areas may be changed by a factor of two, reducing the ratio of input load to output drive by a factor of two as is shown in circuit 601 of FIG. 6B.

Possible Uses

As discussed above, a symmetric multiplexer according to various embodiments of the invention may be included as a part of a high-speed transmission system. More particularly, the multiplexer may be used as in one or more stages of a serial transmitter. For example, a symmetric multiplexer according to one embodiment of the invention may be used as a last stage of a serial transmitter. There may be other practical applications for a symmetric multiplexer. In a serial transmitter, a reduction in phase skew between different inputs is needed to facilitate a 50% duty cycle on the output, and a traditional multiplexer would require external delay elements to accomplish this. Thus, circuitry complexity is reduced. Also, the shallowness of the individual current trees would allow use of a symmetric multiplexer according to one embodiment of the invention when a limited supply voltage prohibits a traditional multiplexer.

Having thus described various illustrative embodiments of the invention, additional modifications and improvements will readily occur to those skilled in the art and are intended to be within the scope of the invention. Accordingly, the foregoing description and drawings are by way of example only, and they are not intended to be limiting. Thus, the breadth and scope of the present invention are not limited by any of the above-described embodiments, but are defined only in accordance with the following claims and their equivalents.

What is claimed is:

1. A multiplexer comprising:
   at least one data terminal;
   at least one select terminal; and
   at least one output terminal, the multiplexer further comprising circuitry that produces a first delay measured between the at least one select and the at least one output terminal, and a second delay measured between the at least one data terminal and the at least one output terminal wherein the first delay is substantially identical to the second delay.

2. The multiplexer according to claim 1, further comprising:
   a first and second symmetric half, each half including a differential current switch for each of a first and second input terminals and the select terminal, and wherein each of the first and second halves is associated with a first and second output, the first and second output being complimentary signals.

3. The multiplexer according to claim 2, wherein each differential current switch is coupled to a current switch comprising a plurality of transistors, wherein each of the differential current switches is adapted to remove a unit of current from at least one of the plurality of transistors.

4. The multiplexer according to claim 3, wherein each of the differential current switches is coupled to the current switch by a respective input line, and wherein for each transition on any one of the first and second input terminals, a current measured on each of the respective input lines does not change by more than one unit of current.

5. The multiplexer according to claim 3, wherein each of the differential current switches is coupled to the current switch by a respective input line, and wherein for each transition on both of the first and second input terminals, a current measured on each of the respective input lines does not change by more than one unit of current.

6. The multiplexer according to claim 3, wherein each of the differential current switches is coupled to the current switch by a respective input line, and wherein for each transition on both the select terminal and at least one of the first and second input terminals, a current measured on each of the respective input lines does not change by more than one unit of current.

7. The multiplexer according to claim 3, wherein the current switch includes at least four input lines, and wherein each of the four input lines is coupled to at least two of the differential current switches, and wherein the at least two of the differential current switches is configured to remove at least one of zero, one, and two units of current from a respective input line.

8. The multiplexer according to claim 1, wherein load measured from the at least one data terminal and at least one select terminal is substantially identical.

9. An apparatus for multiplexing data comprising:
- a first differential current switch having an input that receives a first input signal;
- a second differential current switch having an input that receives a second input signal;
- a third differential current switch having an input that receives a select signal; and
- a current switch, having a first input coupled to the first differential current switch and the third differential current switch and a second input coupled to the second differential current switch and the third differential current switch, each of the first, second, and third differential current switches being is each configured to remove a unit of current from the first input and second input to which the first, second, and third differential current switches are coupled to, respectively.

10. The apparatus according to claim 9, wherein the third differential current switch is configured to remove the unit of current from the first input when the first input when the select signal is asserted, and is configured to remove the unit of current from the second input when the select signal is not asserted.

11. The apparatus according to claim 10, wherein the first differential current switch is coupled to a source voltage, and wherein the first differential current switch is configured to remove the unit of current from the first input when the first input signal is asserted and is configured to remove the unit of current from the source voltage when the first input signal is not asserted.

12. The apparatus according to claim 11, wherein the second differential switch is coupled to a source voltage, and wherein the second differential current switch is configured to remove the unit of current from the second input when the second input is asserted, and is configured to remove the unit of current from the source voltage when the second input signal is not asserted.

13. The apparatus according to claim 9, wherein the first differential current switch is coupled to a source voltage, and wherein the first differential current switch is configured to remove the unit of current from the first input when the first input signal is asserted, and is configured to remove the unit of current from the source voltage when the first input signal is not asserted.

14. The apparatus according to claim 9, wherein the second differential switch is coupled to a source voltage, and wherein the second differential current switch is configured to remove the unit of current from the second input when the second input is asserted, and is configured to remove the unit of current from the source voltage when the second input signal is not asserted.

15. The apparatus according to claim 9, wherein at least two of the first, second, and third differential current switches is configured to remove at least one of zero, one, and two units of current from first input and second input to which the first, second, and third differential current switches are coupled to, respectively.

* * * * *